United States Patent [19]

Manteghi

[11] Patent Number: 5,796,038
[45] Date of Patent: Aug. 18, 1998

[54] TECHNIQUE TO PRODUCE CAVITY-UP HBGA PACKAGES

[75] Inventor: Kamran Manteghi, Manteca, Calif.

[73] Assignee: VLSI Technology, Inc., Sunnyvale, Calif.

[21] Appl. No.: 876,389

[22] Filed: Jun. 16, 1997

[51] Int. Cl.$^6$ .............................. H01L 23/02; H05K 7/20
[52] U.S. Cl. .................... 174/52.4; 257/678; 257/712; 257/738; 361/688
[58] Field of Search .................... 174/52.3, 52.4; 257/737, 738, 697, 693, 700, 702, 712, 720, 690, 772, 774, 779, 780; 361/707, 708, 688, 717, 718

[56] References Cited

U.S. PATENT DOCUMENTS

| | | | |
|---|---|---|---|
| 4,081,825 | 3/1978 | Koopman et al. | 257/717 |
| 5,508,556 | 4/1996 | Lin | 257/691 |
| 5,521,435 | 5/1996 | Mizukoshi | 257/698 |
| 5,591,941 | 1/1997 | Acocella et al. | 174/266 |
| 5,616,958 | 4/1997 | Laine et al. | 257/717 |
| 5,666,272 | 9/1997 | Moore et al. | 361/735 |
| 5,672,913 | 9/1997 | Baldwin et al. | 257/737 |

*Primary Examiner*—Hyung S. Sough
*Assistant Examiner*—Hung V. Ngo
*Attorney, Agent, or Firm*—Patrick T. King

[57] ABSTRACT

A high density ball-grid array package for packaging an integrated-circuit die includes a laminated structure formed of a dielectric layer and a high conductive layer disposed thereon. The dielectric layer has a plurality of first drilled holes, and the conductive layer is formed with a desired pattern. An insulated layer is provided with a plurality of second drilled holes. The laminated substrate is bonded to the insulated substrate so that the plurality of first drilled holes are aligned with corresponding ones of the plurality of second drilled holes in order to form selective solderable areas on the bottom side of the package. The laminated structure has an open portion overlying a central region of the insulated substrate on the top side of the package. An integrated-circuit die is mounted in the central region of the insulated substrate. Bonding wires are interconnected between bonding pads formed on the integrated-circuit die and bonding fingers formed on the conductive layer of laminated structure. A plastic material is molded over the top surface of the die, bonding fingers and bonding wires. Finally, solder balls are attached to the selective solderable areas.

8 Claims, 3 Drawing Sheets

☒ Copper
☐ Polymide
☐ Epoxy
■ Aluminum
☐ Silicon
■ Solder Ball
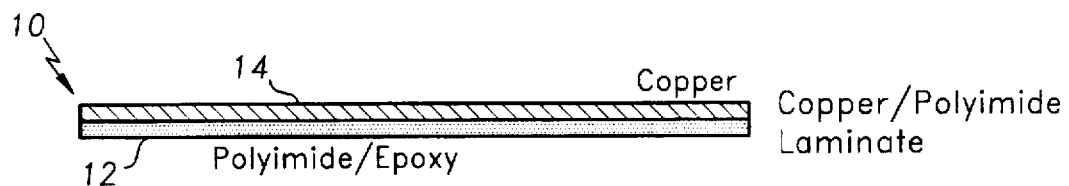
FIG. 1A  Copper/Polyimide Laminate
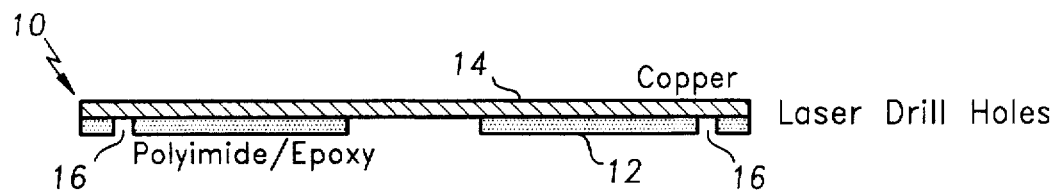
FIG. 1B  Laser Drill Holes
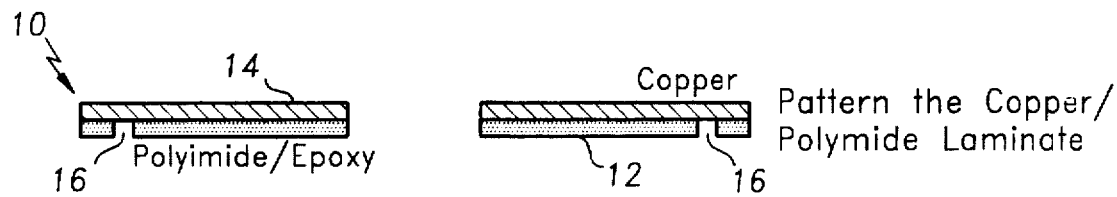
FIG. 1C  Pattern the Copper/Polymide Laminate
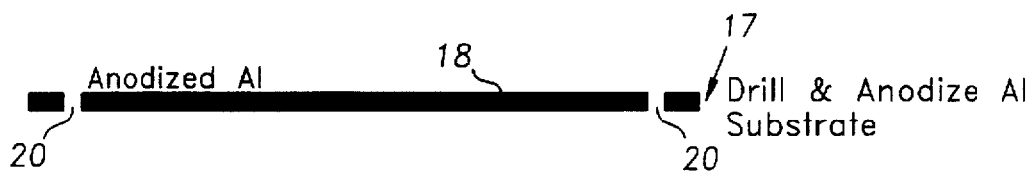
FIG. 1D  Drill & Anodize Al Substrate
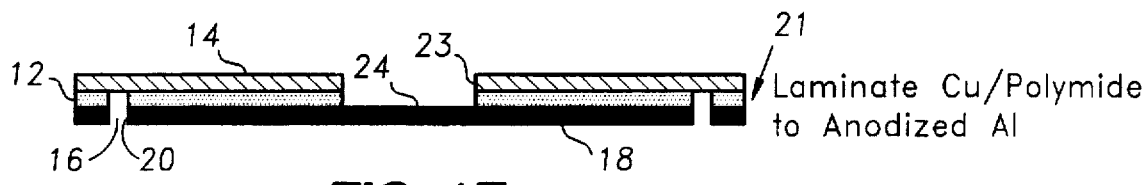
FIG. 1E  Laminate Cu/Polymide to Anodized Al

- ▨ Copper
- ▨ Polymide
- ▨ Epoxy
- ■ Aluminum
- ▢ Silicon
- ■ Solder Ball

TECHNIQUE TO PRODUCE CAVITY-UP HBGA PACKAGES

BACKGROUND OF THE INVENTION

This invention relates generally to semiconductor integrated circuit packages and more particularly, it relates to an improved method for producing cavity-up high density ball-grid array (HBGA) packages of a simple construction which have the ability of dissipating a larger amount of heat.

In recent years, there has existed a high level of interest in the area of ball-grid array (BGA) package and assembly technology. The reason for this is because the package and interconnection industry has departed from the use of pins as connectors for electronic packaging due to their high cost of fabrication, the high failure rate of connections, and the limitation on the density of input/output pins. As a result, solder balls have been used which are superior to pins in the above areas as well as being surface mountable.

The consumers of the existing BGA packages, particularly in the electronic, communication, and computer industries, have been demanding higher and higher die densities to support higher lead counts within the same package footprint area. As a consequence, the number of circuit elements being formed in the semiconductor chip are arranged with a high packing density and a higher level of functions, which has resulted in a substantial increase in the amount of heat per unit volume that must be dissipated by the semiconductor chip. Accordingly, there exists a need for an improved high density BGA package which can dissipate higher amounts of heat due to the electronic and computer industries' demand for higher packing densities within the same conventional BGA package size.

As is generally known in the prior art, there exists high density ball-grid array (HBGA) packages which include an electrically-insulated substrate having a hollow center in which a semiconductor die is mounted therein so as to form what is typically referred to as a "cavity-down" design. In the cavity-down BGA package, the solder balls are attached to appropriate areas on the top surface of the substrate and on the same side as the encapsulant forming the glob top. Further, in order to improve the thermal performance of the BGA package, a copper slug is adhesively attached to the back side of the substrate, which is quite costly.

The inventor of the present invention has developed and new and improved technique for fabricating a cavity-up high density ball-grid array package which is relatively less expensive to manufacture and assemble. Further, the present HBGA package has the capability of higher power dissipation due to the enhanced heat transfer characteristics through the utilization of an anodized aluminum heat slug.

SUMMARY OF THE INVENTION

Accordingly, it is a general object of the present invention to provide an improved high density BGA package which is of a simple construction and is relatively inexpensive to manufacture and assemble.

It is an object of the present invention to provide an improved high density BGA package which has the capability of higher power dissipation within the same conventional package size.

It is another object of the present invention to provide a high density BGA package which includes a laminated structure mounted to the top side of an insulated substrate and solder balls attached to the bottom side thereof.

It is still another object of the present invention to provide a method for fabricating an improved high density BGA package of a simple design, thereby reducing manufacturing and assembly costs.

In accordance with these aims and objectives, the present invention is concerned with the provision of an improved high density ball-grid array package for packaging an integrated-circuit die and a method for fabricating the same. A laminated structure is provided which consists of a dielectric layer and a high conductive layer disposed thereon. The dielectric layer has a plurality of first drilled holes, and the conductive layer is formed with a desired pattern. An insulated substrate is provided which has a plurality of second drilled holes. The laminated substrate is bonded to the insulated substrate so that the plurality of first drilled holes are aligned with corresponding ones of the plurality of second drilled holes in order to form selective solderable areas on the bottom side of a package. The laminated substrate has an open portion overlying a central region of the insulated substrate.

An integrated-circuit die is mounted in the central region of the insulated substrate on the top side of the package. Bonding wires are interconnected between bonding pads formed on the integrated-circuit die and bonding fingers formed on the conductive layer of the laminated substrate. A plastic material is molded over the top surface of the die, bonding fingers and bonding wires. Solder balls are attached to the selective solderable areas.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 1(a) through 1(e) show the initial steps for producing an improved high density BGA package of FIGS. 3 and 4, constructed in accordance with the principles of the present invention;

DESCRIPTION OF THE PREFERRED EMBODIMENT

Reference will now be made in detail to the preferred embodiment of the invention, an example of which is illustrated in the accompanying drawings. While the invention will be described in conjunction with the preferred embodiment, it will be understood that it is not intended to limit the invention to this embodiment. On the contrary, the invention is intended to cover alternatives, modifications and equivalents, which may be included within the spirit and scope of the invention as defined by the appended claims.

Figure 2A:
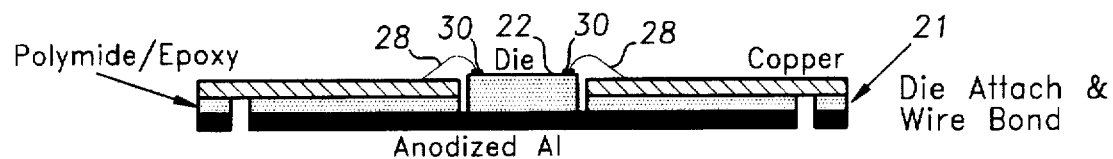
FIGS. 2(a) and 2(b) show the subsequent steps for producing the improved high density BGA package of FIGS. 3 and 4.
Figure 2B:
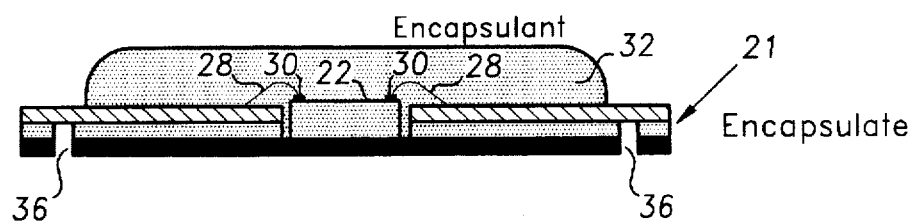
Figure 3:
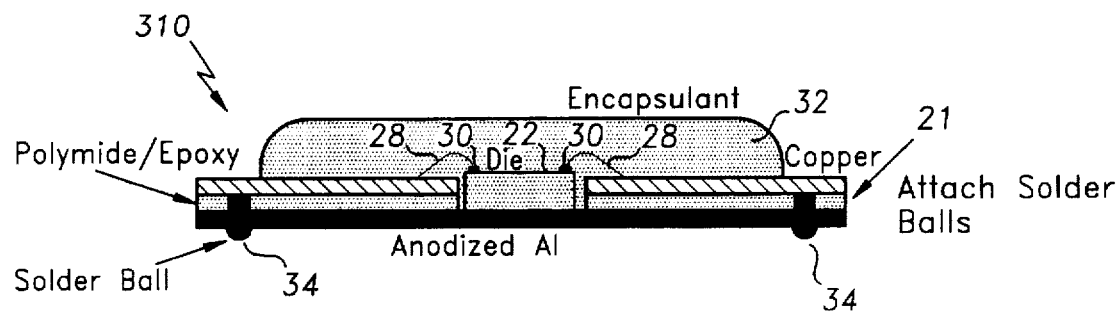
FIG. 3 depicts a cross-sectional view of the improved high density BGA die-up and solder-balls-down package produced in accordance with the teachings of the present invention.
Figure 4:
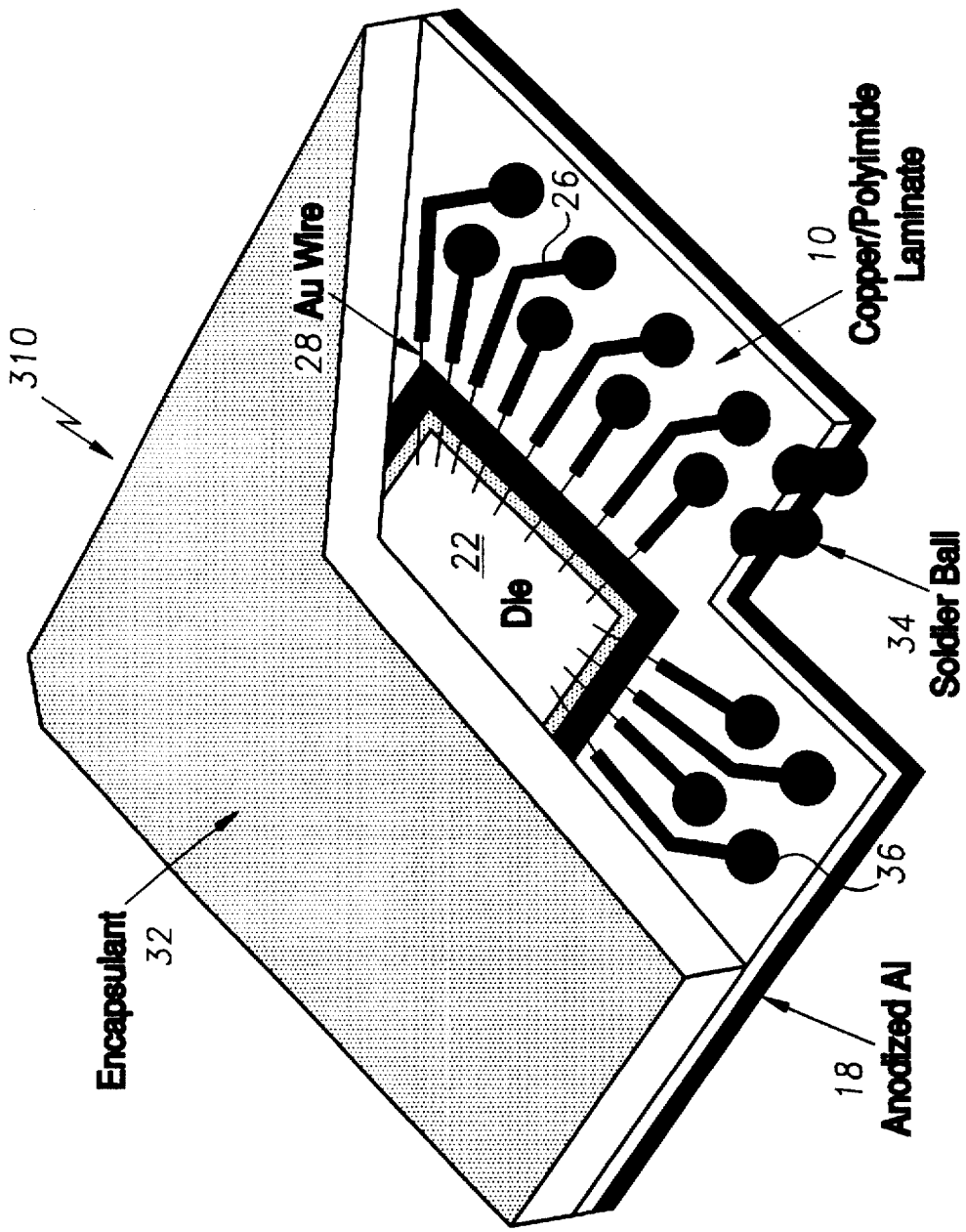
FIG. 4 is a perspective view, partly broken away, of the improved high density BGA package of FIG. 3.

FIGS. 1(a)–1(e) illustrate the initial steps for producing an improved high density BGA package 310 constructed in accordance with the principles of the present invention and as shown in FIGS. 3 and 4. FIGS. 2(a) and 2(b) show the subsequent steps for producing the improved high density BGA package 310. FIG. 3 is a cross-sectional view of the improved high density BGA package 310 which is fabricated in accordance with the steps taught in FIGS. 1 and 2.

FIG. 4 is a perspective view, partly broken away, of the BGA package 310 of FIG. 3.

With particular reference to FIGS. 1(a) through 1(e), there is shown a laminated substrate 10 which includes a dielectric layer 12 and a highly conductive layer 14 disposed thereon. The dielectric layer 12 serves as a printed circuit board and is formed of a non-conductive hermetic material such as FR-4 glass-epoxy, polyimide, or other suitable material. The non-conductive material 12 is preferably formed of a thin layer of polyimide/epoxy film material. The conductive layer 14 is preferably formed of copper or other similar highly conductive material. The copper layer 14 is preferably positioned on the polyimide/epoxy layer 12 by known deposition techniques. One preferred technique is plating or lamination where the copper sheet material is laminated to the dielectric material at elevated temperatures and pressure. This is depicted in FIG. 1(a) as a circuitized copper/polyimide laminated substrate 10.

After the lamination process, the next step involves the placing of holes 16 through the polyimide/epoxy layer 12 as shown in FIG. 1(b). The holes 16 are readily formed utilizing conventional drilling techniques, i.e., conventional mechanical or laser drilling techniques. The polyimide/epoxy layer functions as an electrical insulator between the die and the circuitry of the package. Thereafter, the laminated structure 10 is patterned to the desired format for electrical connections as illustrated in FIG. 1(c).

The fabrication of an insulated substrate 17 is depicted in FIG. 1(d). The substrate 18 is formed of a metallic material such as aluminum or the like. The substrate 18 is typically anodized so as to produce an insulation layer thereon. The substrate 18 and the insulation layer together define an anodized aluminum heat slug 17. The anodized aluminum heat slug is also formed with holes 20 drilled prior to anodization using the same conventional drilling techniques. It is noted that the holes 20 in the heat slug 17 are placed in such a way that they are aligned with corresponding ones of the holes 16 in the laminated structure 10.

The next step of the invention involves the bonding of the laminated structure 10 to the top surface of the anodized aluminum heat slug 17 and is illustrated in FIG. 1(e). The laminated structure 10 of FIG. 1(c) is positioned on top of the heat slug 17 and is laminated thereto with an adhesive film so that the corresponding holes 16 are aligned with the associated holes 20 for forming a laminated assembly 21. Further, it will be noted that the laminated structure has an open portion 23 overlying a central region 24 of the insulated substrate 17.

Now with reference to FIGS. 2(a) and 2(b), a semiconductor integrated-circuit chip or die 22 is mounted in the central region 24 in the top surface of the insulated substrate 17. The die 22 is attached to the top surface of the heat slug 17 via an epoxy such as Ablestik 84-1LMIS which is commercially available from Ablestik, Inc. The innermost ends of patterned conductive traces 26 (as best seen in FIG. 4) are called bonding fingers. Very thin gold wires 28 are bonded between corresponding ones of bonding pads 30 formed on the top surface of the die 22 and corresponding ones of the bonding fingers on the conductive traces 26. This is depicted in FIG. 2(a).

After mounting of the die 22 and the wire bonding process, the laminated assembly and die subassembly are placed in a mold cavity and are hermetically sealed or encapsulated with a plastic molding compound 32. This is shown in FIG. 2(b). The molding compound flows over the top surface of the die 22, the conductive traces 26, and bonding wires 28 and fills the central region 24 so as to form a glob top. The molding compound may, for example, be a standard molding compound such as provided by the Sumitomo Company as 6300 HS or HG molding compound or as 7320C low viscosity molding compound.

Thereafter, a plurality of solder balls 34 are attached to the selective solderable areas 36 which have been previously formed by the aligned drilled holes 16 and 20. This completed high density BGA package 310 is depicted in FIG. 3. The solder balls 34 are made of eutectic solder material, preferably 63% Sn and 37% Pb so as to reflow for joining the solder balls to the next-level board (i.e., motherboard). One conventional technique suitable for mounting the solder balls 24 to the selective solderable areas 36 is by a solder reflow process.

A perspective view, partially cut away, of the completed high density BGA package 310 of FIG. 3 is illustrated in FIG. 4. Unlike the prior art "cavity-down" high density BGA package, the "cavity-up" high density BGA package 310 of the present invention has eliminated the use of a copper slug attached to the substrate and instead utilizes an insulated substrate 17 on which the laminated structure 10 is attached on its top. In this manner, the high density BGA package 310 of the present invention can dissipate higher amounts of heat due to the enhanced heat transfer characteristics of the anodized aluminum heat slug 17. Further, the present high density BGA package for the integrated-circuit die can be manufactured relatively inexpensively with commercially available industrial equipment.

From the foregoing detailed description, it can thus be seen that the present invention provides an improved high density ball-grid array package for packaging an integrated-circuit die which has the ability of dissipating a larger amount of heat. The high density BGA package of the present invention includes a laminated structure having an open portion and an insulated substrate having a central region. The laminated structure is bonded to the insulated substrate so that an open portion thereof overlies the central region of the insulated substrate. A plurality of first drilled holes in the laminated structure are aligned with a plurality of second drilled holes in the insulated substrate so as to form selective solderable areas. After the die and wire bonding process, a plastic material is molded over the top surface of the die, bonding fingers and bonding wires. Finally, solder balls are attached to the selective solderable areas.

What is claimed is:

1. A high density ball-grid array package for packaging an integrated-circuit die comprising:

a laminated structure consisting of a dielectric layer and a highly conductive layer disposed thereon;

said dielectric layer having a plurality of first drilled holes to expose selective solderable areas on a bottom side of said conductive layer and said conductive layer being formed with a desired pattern wherein said dielectric layer is comprised of a material selected from the group consisting of a polyimide material and an epoxy material;

an insulated substrate having a plurality of second drilled holes wherein said insulated substrate is comprised of an aluminum layer which is anodized so as to form an insulation layer thereon;

said laminated structure being bonded to said insulated substrate so that said plurality of first drilled holes are aligned with corresponding ones of said plurality of second drilled holes in order to expose the selective solderable areas on the bottom side of the conductive layer of the high density ball-grid array package;

said laminated structure having an open portion overlying a central region of said insulated substrate;

an integrated-circuit die being mounted in the central region of said insulated substrate on a top side of said high density ball-grid array package;

bonding wires interconnected between bonding pads formed on said integrated-circuit die and bonding fingers formed on said conductive layer of said laminated structure;

a plastic material being molded over a top surface of said die, bonding fingers and bonding wires all located on the top side of said high density ball-grid array package; and solder balls being directly attached to said selective solderable areas exposed on the bottom side of the conductive layer of said high density ball-grid array package.

2. A high density ball-grid array package as claimed in claim 1, wherein said highly conductive layer is made of copper.

3. A high density ball-grid array package as claimed in claim 1, wherein said solder balls are comprised of eutectic solder bumps.

4. A high density ball-grid array package as claimed in claim 3, wherein said solder balls are comprised of 63% Sn and 37% Pb.

5. A method for fabricating a high density ball-grid array package for an integrated-circuit die, comprising the steps of:

forming a laminated structure consisting of a dielectric layer and a high conductive layer disposed thereon;

drilling a plurality of first holes in the dielectric layer to expose selective solderable area on a bottom side of said conductive layer, wherein said dielectric layer is comprised of a material selected from the group consisting of a polyimide material and an epoxy material;

applying a desired pattern to the conductive layer;

forming an insulated substrate having a plurality of second holes wherein said insulated substrate is comprised of an aluminum metallic layer which is anodized so as to form an insulation layer thereon;

bonding the laminated structure to the insulated substrate so that the plurality of first holes are aligned with corresponding ones of the plurality of second holes in order to expose the selective solderable areas on the bottom side of said conductive layer of the high density ball-grid array package, the laminated structure having an open portion overlying a central region of the insulated substrate;

mounting an integrated-circuit die in the central region of the insulated substrate on a top side of said high density ball-grid array package;

interconnecting bonding wires between bonding pads formed on the integrated-circuit die and bonding fingers formed on the conductive layer of the laminated structure;

molding a plastic material on the top side of said high density ball-grid array package and over a top surface of the die, bonding fingers and bonding wires; and attaching solder balls directly to the selective solderable areas exposed on the bottom side of the conductive layer.

6. A method for fabricating a high density ball-grid array package as claimed in claim 5, wherein said highly conductive layer is made of copper.

7. A method for fabricating a high density ball-grid array package as claimed in claim 5, wherein said solder balls are comprised of eutectic solder bumps.

8. A method for fabricating a high density ball-grid array package as claimed in claim 7, wherein said solder bumps are comprised of 60% Sn and 40% Pb.

* * * * *